United States Patent [19]
Ong

[11] Patent Number: 6,166,976
[45] Date of Patent: Dec. 26, 2000

[54] MULTIPLE EQUILIBRATION CIRCUITS FOR A SINGLE BIT LINE

[75] Inventor: Adrian E. Ong, Pleasanton, Calif.

[73] Assignee: G-Link Technology, Santa Clara, Calif.

[21] Appl. No.: 09/418,959

[22] Filed: Oct. 15, 1999

Related U.S. Application Data

[62] Division of application No. 09/089,928, Jun. 3, 1998.

[51] Int. Cl.[7] .................................................. G11C 7/00
[52] U.S. Cl. ............................................................ 365/203
[58] Field of Search .................................. 365/190, 203, 365/205, 207, 208

[56] References Cited

U.S. PATENT DOCUMENTS

| | | | |
|---|---|---|---|
| 5,291,433 | 3/1994 | Itoh | 365/63 |
| 5,444,662 | 8/1995 | Tanaka et al. | 365/203 |
| 5,691,933 | 11/1997 | Takenaka | 365/63 |
| 5,701,268 | 12/1997 | Lee et al. | 365/205 |
| 5,740,113 | 4/1998 | Kaneko | 365/203 |
| 5,768,199 | 6/1998 | Inoue | 365/203 |
| 6,034,884 | 3/2000 | Jung | 365/203 |

Primary Examiner—Trong Phan
Attorney, Agent, or Firm—Skjerven, Morrill, MacPherson, LLP

[57] ABSTRACT

According to one embodiment, a memory device comprises a bit line operable to access a memory cell. The bit line has a first end and a second end. A first equilibration circuit is coupled to the first end of the bit line, and a second equilibration circuit is coupled to the second end of the bit line. The first and second equilibration circuits cooperate to pre-charge the bit line. According to another embodiment, an embedded-process memory device comprises a p-well and a deep n-well formed into a substrate. A retrograde well is formed into the deep n-well. An equilibration circuit for pre-charging a bit line is formed into the retrograde well.

18 Claims, 5 Drawing Sheets

FIG. 2c

MULTIPLE EQUILIBRATION CIRCUITS FOR A SINGLE BIT LINE

CROSS-REFERENCE TO RELATED APPLICATION

This is a divisional of U.S. application Ser. No. 09/089,928, filed Jun 3, 1998, entitled "Multiple Equilibration Circuits; For A Single Bit Line," by Adrian Ong.

FIELD OF THE INVENTION

The present invention relates generally to the field of semiconductor integrated circuits, and more particularly, to multiple equilibration circuits for a single bit line.

BACKGROUND OF THE INVENTION

Integrated circuit (IC) memory devices allow large amounts of data to be stored in relatively small physical packages. One such device is a random access memory (RAM). A RAM comprises a plurality of memory cells, each of which is accessible by at least one data line commonly referred to as a "bit line." As data is written into and read out of a memory cell, the voltage appearing on the respective bit line may alternate between high and low values.

According to previously developed techniques, in order to provide faster operation for a RAM, an equilibration circuit is coupled to one end of a bit line. The equilibration circuit pre-charges the voltage on the bit line to a predetermined value, which is typically midway between the high and low voltage values. This pre-charging to a mid-level value allows the voltage on the bit line to be moved more rapidly to either the high value or the low value, thereby increasing the speed at which data is written into or read out of a memory cell. Nonetheless, because the portion of a bit line furthest from the equilibration circuit is charged more slowly than the portion closest to the equilibration circuit, a certain amount of delay is associated with pre-charging the far end of the bit line up to the desired mid-level value. For longer bit lines, such a time delay can be significant.

SUMMARY

The disadvantages and problems associated with pre-charging a bit line have been substantially reduced or eliminated using the present invention.

In accordance with one embodiment of the present invention, a memory device comprises a bit line operable to access a memory cell. The bit line has a first end and a second end. A first equilibration circuit is coupled to the first end of the bit line, and a second equilibration circuit is coupled to the second end of the bit line. The first and second equilibration circuits cooperate to pre-charge the bit line.

In accordance with another embodiment of the present invention, an embedded-process memory device comprises a p-well and a deep n-well formed into a substrate. A retrograde well is formed into the deep n-well. An equilibration circuit for pre-charging a bit line is formed into the retrograde well.

An important technical advantage of the present invention includes using multiple equilibration circuits to pre-charge a bit line in a memory device. In one embodiment, a separate equilibration circuit is coupled to each end of a bit line so that each equilibration circuit is only required to pre-charge one half the bit line. If performance of the memory device is the most important consideration, then for a given length of bit line, the use of multiple equilibration circuits allows the bit line to be pre-charged more rapidly than if a single equilibration circuit is used. Alternatively, if capacity of the memory device is the most important consideration, then the use of multiple equilibration circuits allows the length of each bit line to be extended, thereby supporting more memory cells, without an increase in the time required for pre-charging.

Another important technical advantage of the present invention includes forming an equilibration circuit within the memory array of a triple-well memory device. A triple-well memory device comprises i number of wells into which various circuit elements (e.g., transistors) may be formed. Different wells are used for a memory array and a pitch area of the memory device. According to an embodiment of the present invention, an equilibration circuit is formed within a well of the memory array. At this location, the equilibration circuit can act as a "dummy" interface to smooth the transition between the memory array and pitch area, thereby reducing edge defects in this region. In addition., at this location, the equilibration circuit does not further "crowd" the circuitry implemented in the pitch area. Furthermore, if the equilibration circuit is formed in the retrograde well, array processing techniques can be used. Generally, array processing techniques produce a smaller layout than pitch processing techniques.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIGS. 2, 2a, 2b, and 2c are a schematic diagram of multiple equilibration circuits for a single bit line, in accordance with an embodiment of the present invention.

DETAILED DESCRIPTION OF THE PREFERRED EMBODIMENTS

Figure 1:
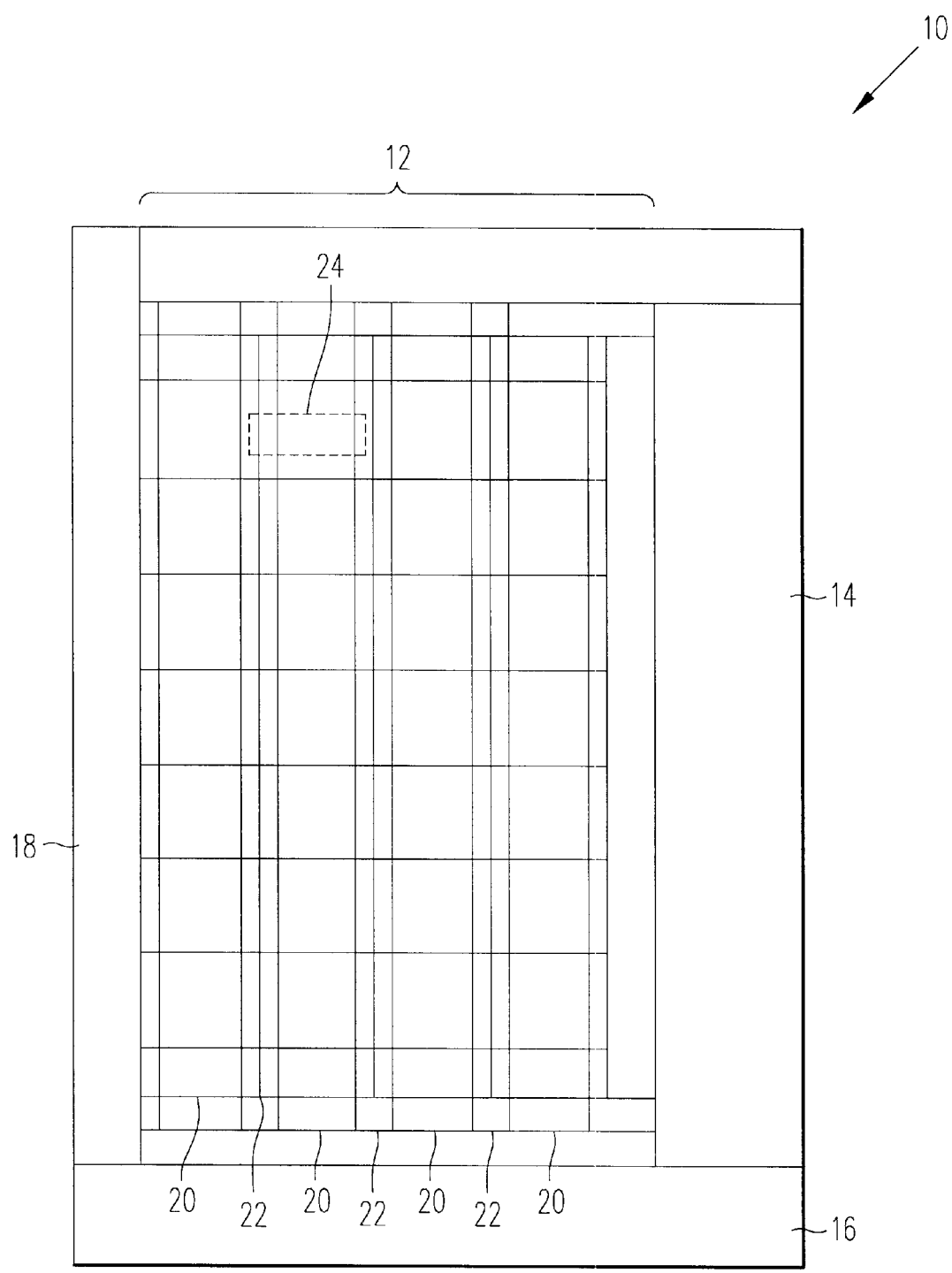
FIG. 1 illustrates an exemplary integrated circuit memory device into which an embodiment of the present invention may be incorporated.
Figure 2A:
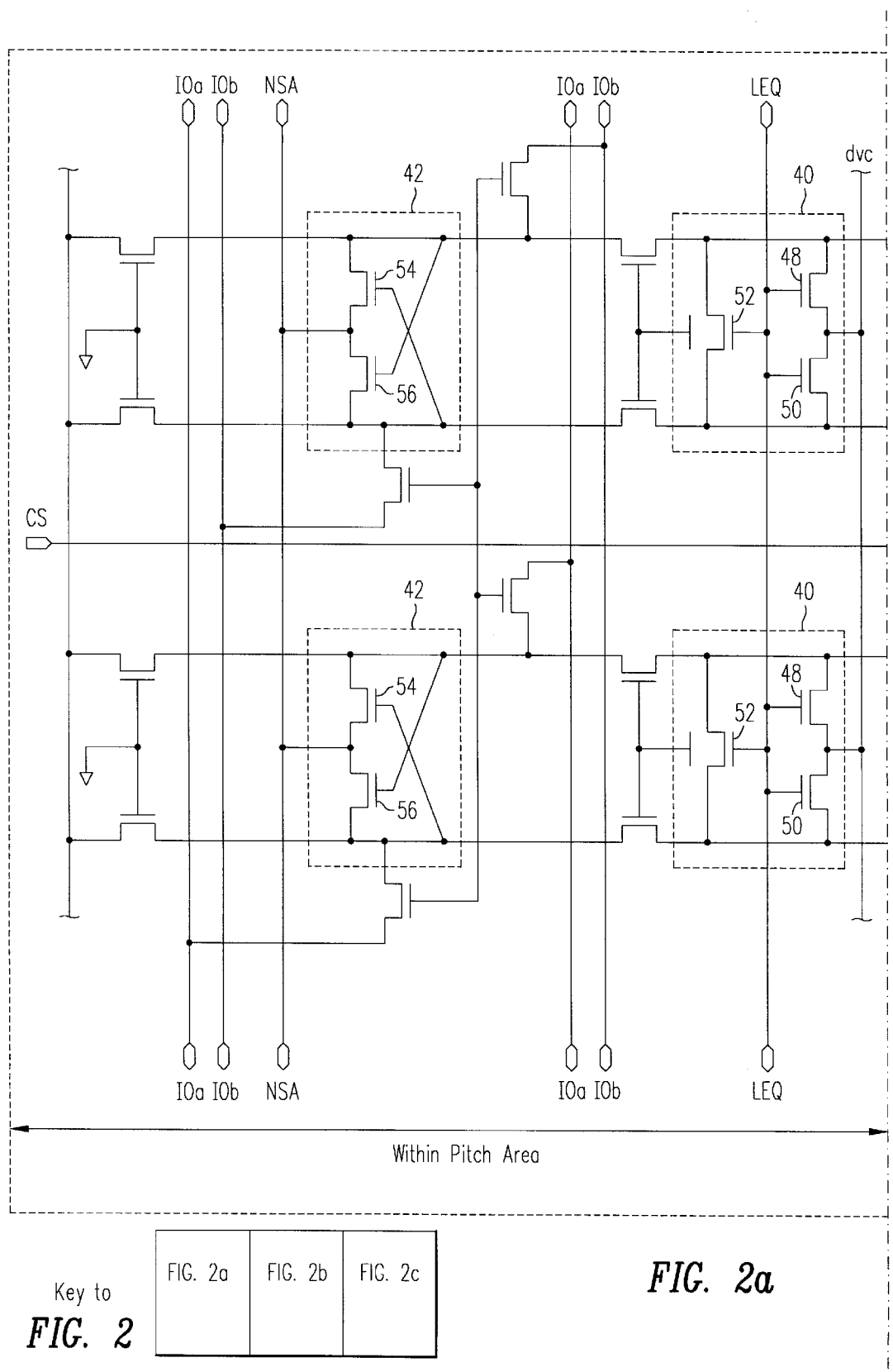
Figure 2B:
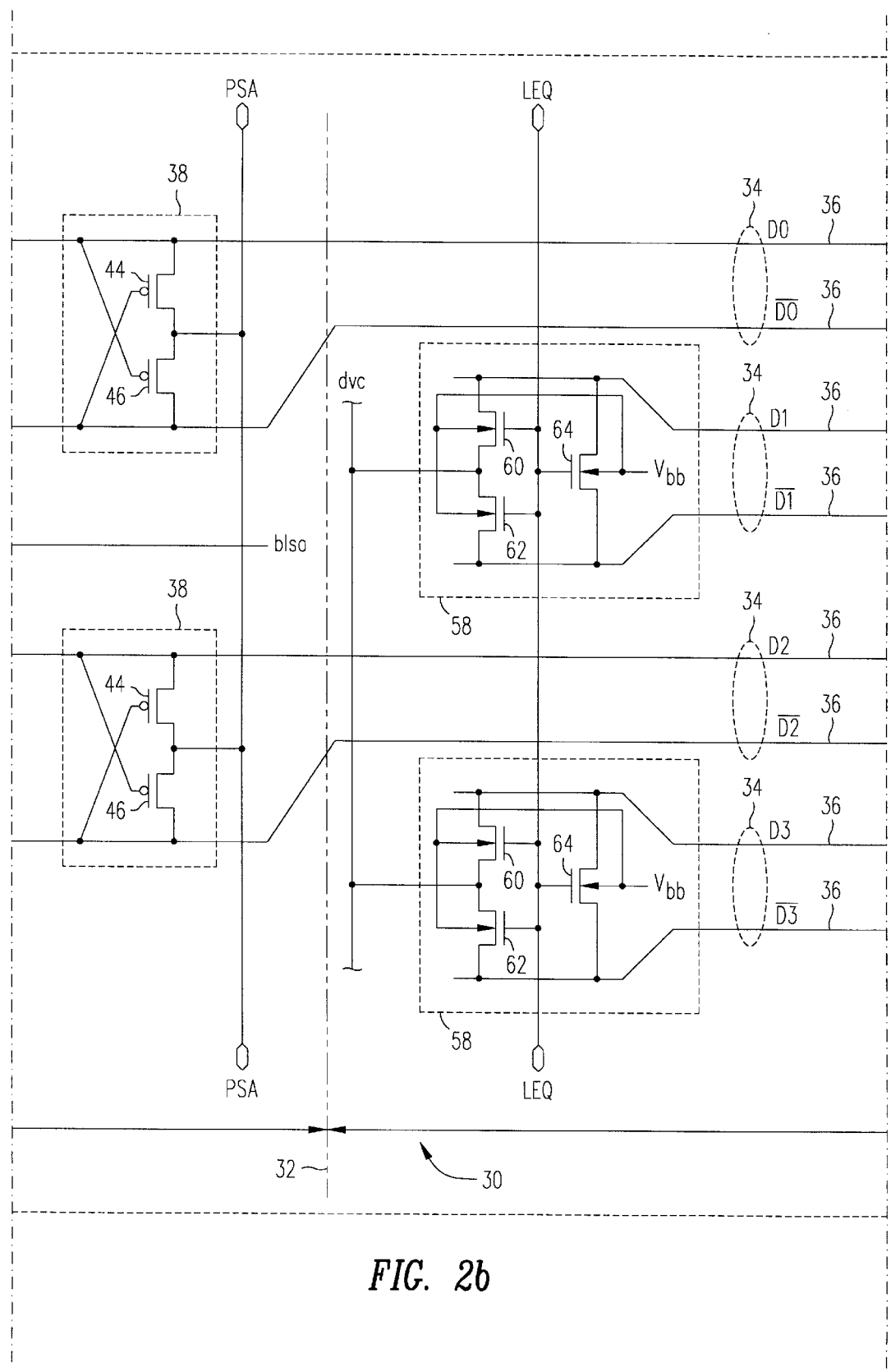
Figure 2C:
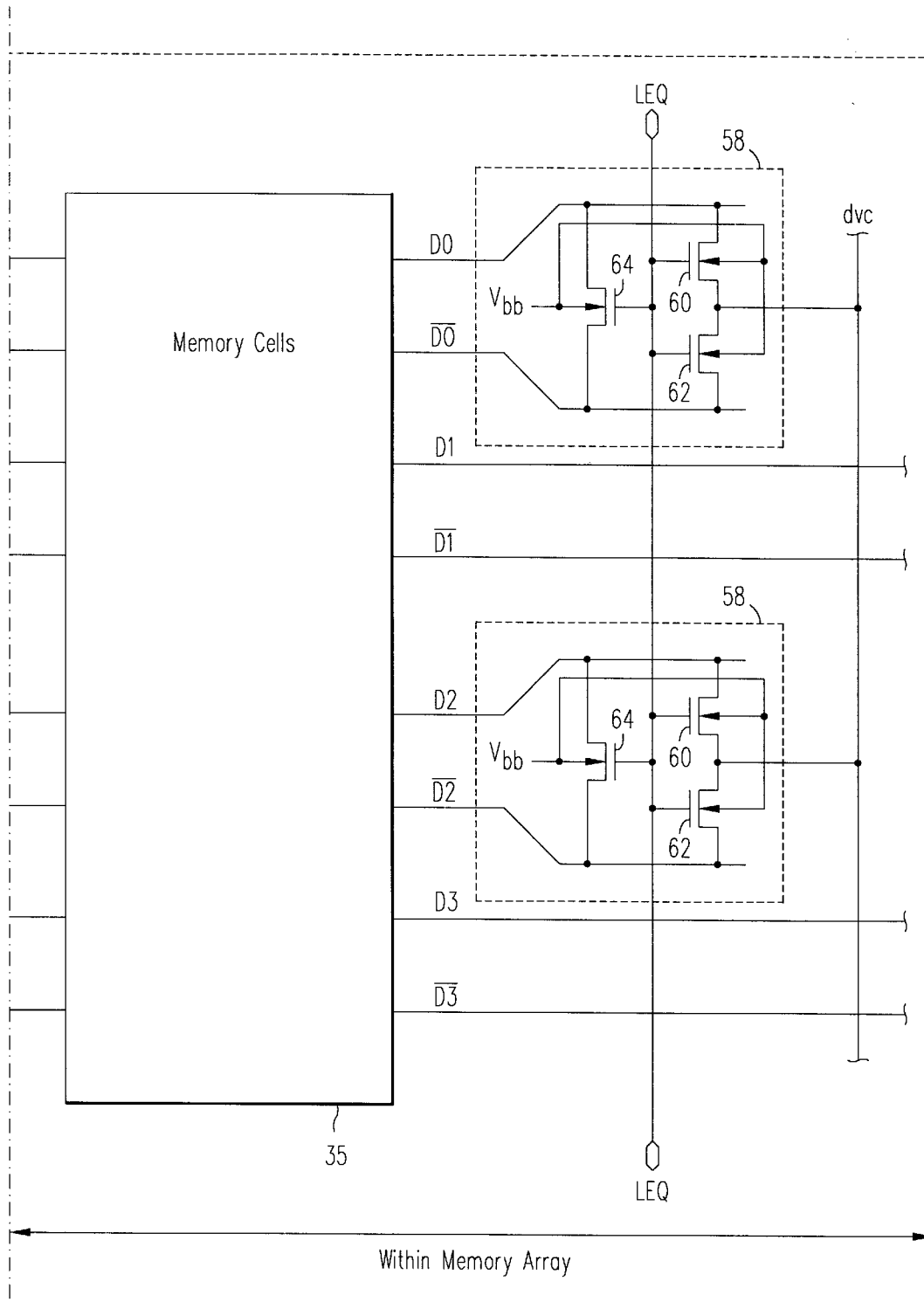
Figure 3:
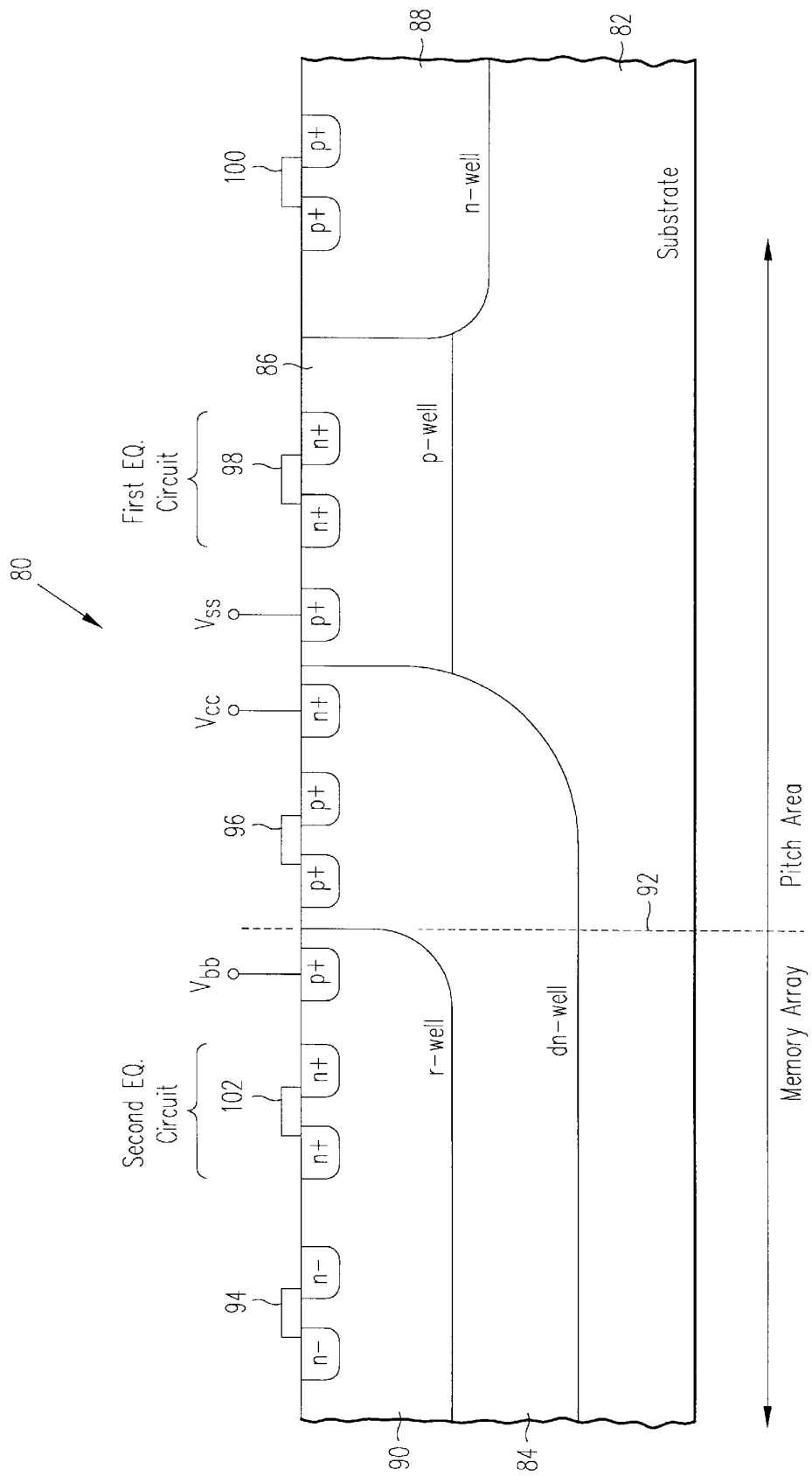
FIG. 3 illustrates the formation of an equilibration circuit in a well of a memory array, in accordance with an embodiment of the present invention.

The preferred embodiments of the present invention and their advantages are best understood by referring to FIGS. 1 through 3 of the drawings. Like numerals are used for like and corresponding parts of the various drawings.

FIG. 1 illustrates an exemplary layout of an integrated circuit (IC) memory device 10 into which an embodiment of the present invention may be incorporated. Memory device 10, which can be an implementation for random access memory (RAM), includes a memory area 12 surrounded by a control logic area 14, a data path area 16, and a pump/voltage regulator area 18.

Memory area 12 is separated into a number of arrays 20, each of which comprises a plurality of memory cells accessible by one or more respective bit lines (not shown). Each memory cell functions to store data or information therein. A plurality of pitch areas 22 are disposed between memory arrays 20. Each pitch area 22 comprises a number of circuits which support the writing, storage, access, and/or reading of information from memory arrays 20. For example, pitch areas 22 may include one or more write amplifiers, to drive the memory, and sense amplifiers, to detect (read) the stored information. Furthermore, each pitch area 22 can include a number of equilibration circuits for pre-charging voltages on bit lines in the memory arrays 20.

Logic area 14, data path area 16, and pump/voltage regulator area 18 constitute a "peripheral" area for memory area 12. Each of logic area 14, data path area 16, and pump/voltage regulator area 18 comprises one or more circuits which support the storage, maintenance, and/or access of information in memory area 12. In particular, logic section 14 may include a number of row and column decoders for accessing the various memory cells in memory area 12. Data path portion 16 may include various lines over which information may be written into and read out of the memory cells of memory area 12. Pump/voltage regulator area 18 may include various power sources and pumps to drive, and thereafter maintain, information in the memory cells of memory area 12. These include, for example, sources for $V_{cc}$, $V_{ss}$, and $V_{bb}$.

In accordance with an embodiment of the present invention, multiple equilibration circuits may be coupled to each bit line in memory area 12. This improves the performance of memory device 10 by reducing the time required to pre-charge bit lines to a mid-level value. Such performance-improving circuitry can be corporated into memory arrays 20 and pitch areas 22, for example, within exemplary section 24, as described in more detail with reference to FIGS. 2, 2a, 2b, and 2c.

Furthermore, in accordance with another embodiment of the present invention, at least a portion of the equilibration circuits coupled to the bit lines can be implemented in the wells into which memory arrays 20 are formed. This implementation can be accomplished without significantly increasing the surface area required for memory device 10. Such an embodiment is illustrated and described below in more detail with reference to FIG. 3.

FIGS. 2, 2a, 2b, and 2c are a schematic diagram of exemplary circuitry 30 in which multiple equilibration circuits are provided for a single bit line of a memory device, in accordance with an embodiment of the present invention. Circuitry 30 can be located partially within a pitch area and partially within a memory array, such as, for example, within section 24 of FIG. 1. The physical division between the pitch area and the memory array is indicated by line 32 extending vertically in FIG. 2b.

A plurality of bit line pairs 34 are located within the memory array. Each bit line pair 34 is connected to one or more respective memory cells within a memory cell portion 35. As used herein, the terms "connected," "coupled," or any variant thereof mean any connection or coupling, either direct or indirect, between two or more elements. Bit line pairs 34 support the writing and reading of information into and out of the respective memory cells. Each bit line pair 34 comprises two bit lines 36: one bit line 36 is provided for a binary "1" or high value of the information for the respective memory cells; the other bit line 36 is provided for the complement, comprising a binary "0" or low value for the same information. Thus, as shown, information D0, D1, D2, and D3 are each accessible by one bit line 36 of a respective bit line pair 34, while the complements $\overline{D0}$, $\overline{D1}$, $\overline{D2}$, and, $\overline{D3}$ are accessible by the other bit line 36 of the respective pair. As information is written into and read out of the memory cells, the voltages appearing on the respective bit lines 36 may alternate between high and low values, wherein the high value can be $V_{cc}$, and the low value can be ground.

A p-type sense amplifier 38, a first equilibration circuit 40, and an n-type sense amplifier 42 are sequentially coupled to each bit line pair 34 and located within the pitch area. Each p-type sense amplifier 38 functions to sense or read information stored within the memory cells supported by the respective bit line pair 34. Each p-type sense amplifier 38 comprises two p-type transistors 44 and 46 coupled between the two bit lines 36 of the respective bit line pair 34. With respect to a particular p-type sense amplifier 38, the gate of transistor 44 is connected to one bit line 36 while the gate of transistor 46 is connected to the other bit line 36. The source of transistor 44 is connected to the bit line 36 opposite that to which its gate is coupled. The drain of transistor 44 is connected to the source of transistor 46, at which point a p-type sense amplifier (PSA) latch signal is applied. The drain of transistor 46 is connected to the bit line 36 opposite that to which its gate is coupled.

Each n-type sense amplifier 42 generally performs the same function as a p-type amplifier 38—i.e., to sense or read information stored within the memory cells supported by the respective bit line pair 34. Each n-type sense amplifier 42 comprises two n-type transistors 54 and 56. The gate of each n-type transistor is connected to one of bit lines 36 of the respective bit line pair 34. The drain of transistor 54 is connected to the bit line 36 opposite that to which its gate is coupled. The source of transistor 54 is connected to the drain of transistor 56, at which point an n-type sense amplifier (NSA) latch signal may be applied. The source of transistor 56 is connected to the bit line 36 opposite that to which its gate is coupled.

First equilibration circuits 40 function generally to pre-charge the two bit line 36 of the respective bit line pairs 34 to a voltage level that is between ground and $V_{cc}$. Each first equilibration circuit 40 may comprise three n-type transistors 48, 50, and 52. The gates of all these transistors are connected together and may receive an equilibration (LEQ) signal. The drains of each of transistors 48 and 52 are connected to one bit line 36 of the respective bit line pair 34, and the sources of transistors 50 and 52 are connected to the other bit line 36. The source of transistor 48 and the drain of transistor 50 are connected to a voltage source dvc. Voltage source dvc may have a value of one-half $V_{cc}$.

A second equilibration circuit 58 is coupled to each bit line pair 34 at an end of the bit line pair opposite the first equilibration circuit 40. As explained in more detail below, each second equilibration circuit 58 cooperates with the respective first equilibration circuit 40 to pre-charge the bit lines 36 of the associated bit line pair 34. In contrast to first equilibration circuits 40, second equilibration circuits 58 may be located within the memory array. Each second equilibration circuit 58 comprises three n-type transistors 60, 62, and 64. For each second equilibration circuit 58, the drain of transistor 60 is connected to one bit line 36 of bit line pair 34 while the source of transistor 62 is connected to the other bit line 36. The source of transistor 60 and the drain of transistor 62 are connected to voltage source dvc. The drain of transistor 64 is connected to one bit line 36 while its source is connected to the other bit line 36. The gates of transistors 60, 62, and 64 are all corrected to the LEQ signal. A back bias voltage $V_{bb}$ is applied to each of these transistors.

With respect to a particular bit line pair 34, in operation, the respective first equilibration circuit 40 and second equilibration circuit 58 cooperate to pre-charge bit lines 36 of the bit line pair 34 to a value of approximately one half $V_{cc}$. In particular, first equilibration circuit 40 charges the bit lines 36 from one end, while second equilibration circuit 58 charges the bit lines 36 from the opposite end. This is accomplished as follows. A high voltage value is applied at the input for the LEQ signal. This high value turns on all of the transistors in first equilibration circuit 40 and second equilibration circuit 58, thereby shorting the two bit lines 36. At first equilibration circuit 40, one end of both bit lines 36 is pre-charged to a value of approximately one-half $V_{cc}$ by the voltage source dvc operating through transistors 48 and 50. At second equilibration circuit 58, the opposite end of both bit lines 36 is pre-charged to one-half the value of $V_{cc}$ by the voltage source dvc operating through transistor 60 and 62. Each of first equilibration circuit 40 and second equilibration circuit 58 is only required to pre-charge one half the length of bit lines 36.

If performance of the memory device is the most important consideration, then for a given length of a bit line 36, the use of first and second equilibration circuits 40 and 58 allows the bit line 36 to be pre-charged more rapidly than if a single equilibration circuit is used. Alternatively, if capacity of the memory device is the most important consideration, then the use of both equilibration circuits 40 and 58 allows the length of each bit line 36 to be extended, thereby supporting more memory cells, without an increase in the time required for pre-charging.

FIG. 3 illustrates the formation of an equilibration circuit in a well of a memory array, in accordance with an embodiment of the present invention. Referring to FIG. 3, a structure 80 comprises a portion of an integrated circuit memory device formed by an embedded process. Such memory device can be a dynamic random access memory (DRAM). The embedded process is; known and understood by those of ordinary skill in the art of integrated circuit manufacturing. One part of structure 80 may lie within the memory array of the device while another part of structure 80 may lie in the pitch area. Structure 80 comprises a substrate 82 having a number of wells formed therein. These wells include a deep n-well (dn-well) 84, a p-well 86, and an n-well 88. A retrograde well (r-well) 90 is formed within deep n-well 84. A border of retrograde well 90 defines the physical division between the memory array and the pitch area, as delineated by line 92. Voltage sources $V_{cc}$, $V_{ss}$, and $V_{bb}$ bias deep n-well 84, p-well 86, and retrograde well 90, respectively. In other words, deep n-well 84 is coupled to a voltage source, p-well 86 is grounded, and retrograde well 90 is back-biased.

Various circuit elements, such as transistors, may be formed within each of wells 84, 86, 88, and 90. As shown, exemplary n-type transistor 94 is formed in retrograde well 90, exemplary p-type transistor 96 is formed in deep n-well 84, exemplary n-type transistor 98 is formed in p-well 86, and exemplary p-type transistor 100 is formed in n-well 88. Specific circuits can be implemented with these transistors. For example, n-type transistor 98 in p-well 86 can be used to implement a first equilibration circuit (see FIG. 2).

In accordance with an embodiment of the present invention, a second equilibration circuit can be implemented using transistors, such as exemplary transistor 102, formed within retrograde well 90. This location for the second equilibration circuit provides numerous advantages. For example, at this location, the second equilibration circuit can act as a "dummy" interface to smooth the transition between the memory array and pitch area, thereby r educing edge defects in this region. In addition, at this location, the second equilibration circuit does not further "crowd" the circuitry implemented in the pitch area. Furthermore, if the second equilibration circuit is formed in retrograde well 90, array processing techniques can be used. Generally, array processing techniques produce a smaller layout than pitch processing techniques.

Although the present invention and its advantages have been described in detail, it should be understood that various changes, substitutions, and alterations can be made therein without departing from the spirit and scope of the invention as defined by appended claims.

What is claim is:

1. A memory device comprising:
   a bit line operable to access a memory cell, the bit line having a first end and a second end;
   a first equilibration circuit coupled to the first end of the bit line; and
   a second equilibration circuit coupled to the second end of the bit line, wherein the second equilibration circuit cooperates with the first equilibration circuit to simultaneously pre-charge the first and the second ends of the bit line.

2. The memory device of claim 1, wherein:
   the first equilibration circuit is located within a pitch area of the memory device; and
   the second equilibration circuit is located within a memory array of the memory device.

3. The memory device of claim 2, further comprising a sense amplifier for reading information stored in the memory cell, the sense amplifier located within the pitch area of the memory device.

4. The memory device of claim 1, comprising:
   a p-well formed into a substrate;
   a deep n-well formed into the substrate; and
   a retrograde well formed into the deep n-well.

5. The memory device of claim 4, wherein:
   the first equilibration circuit is formed in the p-well; and
   the second equilibration circuit is formed in the retrograde well.

6. The memory device of claim 5, wherein:
   the p-well is grounded; and
   the retrograde well is back-biased.

7. The memory device of claim 1, wherein the first and second equilibration circuits are each operable to short the bit line.

8. A method comprising:
   pre-charging a first end of a bit line in a memory device with a first equilibration circuit; and
   simultaneously pre-charging a second end of the bit line with a second equilibration circuit.

9. The method of claim 8, wherein:
   the first equilibration circuit is located within a pitch area of the memory device; and
   the second equilibration circuit is located within a memory array of the memory device.

10. The method of claim 8, further comprising shorting the bit line.

11. A memory device comprising:
   a bit line pair comprising a first and a second bit lines operable to access a memory cell, the bit line pair having a first end and a second end;
   a first equilibration circuit coupled to the first end of the bit line pair; and
   a second equilibration circuit coupled to the second end of the bit line pair, wherein the second equilibration circuit cooperates with the first equilibration circuit to simultaneously pre-charge the first and second ends of the bit line pair.

12. The memory device of claim 11, wherein:
   the first equilibration circuit is located within a pitch area of the memory device; and the second equilibration circuit is located within a memory array of the memory device.

13. The memory device of claim 11, wherein the first and second equilibration circuits are each operable to short the first and second bit lines of the bit line pair.

14. The memory device of claim 11, comprising:

a p-well formed into a substrate;

a deep n-well formed into the substrate; and a retrograde well formed into the deep n-well.

15. The memory device of claim 14, wherein:

the first equilibration circuit is formed in the p-well; and the second equilibration circuit is formed in the retrograde well.

16. The memory device of claim 11, wherein the second equilibration circuit comprises:

a first transistor having a drain connected to the first bit line and a source connected to the second bit line;

a second transistor having a drain connected to the first bit line;

a third transistor having a drain connected to a source of the second transistor and a source connected to the second bit line; and wherein a gate of each of the first, second, and third transistors receives an equilibration signal.

17. A method comprising:

shorting together two bit lines of a bit line pair in a memory device;

pre-charging a first end of each bit line with a first equilibration circuit; and simultaneously pre-charging a second end of each bit line with a second equilibration circuit.

18. The method of claim 17, wherein:

the first equilibration circuit is located within a pitch area of the memory device; and the second equilibration circuit is located within a memory array of the memory device.

* * * * *